United States Patent

Vadasz

[15] 3,699,646

[45] Oct. 24, 1972

[54] INTEGRATED CIRCUIT STRUCTURE AND METHOD FOR MAKING INTEGRATED CIRCUIT STRUCTURE

[72] Inventor: Leslie L. Vadasz, Sunnyvale, Calif.

[73] Assignee: Intel Corporation, Mountain View, Calif.

[22] Filed: Dec. 28, 1970

[21] Appl. No.: 101,805

[52] U.S. Cl. ........................29/571, 29/578, 29/589, 148/187, 148/188

[51] Int. Cl. ..........B01j 17/00, H01j 1/14, H01j 5/02

[58] Field of Search........29/589, 590, 591, 571, 578; 317/235

[56] References Cited

UNITED STATES PATENTS 3,566,518 3/1971 Brown et al. ................29/571
3,544,399 12/1970 Dill............................148/187
3,576,478 4/1971 Watkins....................317/235
3,502,517 3/1970 Sussmann..................148/175

*Primary Examiner*—John F. Campbell
*Assistant Examiner*—D. M. Heist
*Attorney*—Spensley, Horn and Lubitz

[57] ABSTRACT

In connection with the fabrication of an integrated circuit, a method for simultaneously completing the formation of a contact, an interconnect, a gate and a source or drain is disclosed. An integrated circuit field effect structure wherein a diffused silicon area is connected directly to a polysilicon member by conductive silicon and more specifically the source or drain of one device is directly and continuously connected to the gate of an adjacent device by a conductive silicon member.

7 Claims, 7 Drawing Figures

PATENTED OCT 24 1972 3,699,646

LESLIE L. VADASZ
INVENTOR

BY Spensley, Horn & Lubitz
ATTORNEYS

INTEGRATED CIRCUIT STRUCTURE AND METHOD FOR MAKING INTEGRATED CIRCUIT STRUCTURE

BACKGROUND OF THE INVENTION

1. Field of the Invention

This invention relates to the field of semiconductor integrated circuits.

2. Prior Art

In the semiconductor arts, field effect devices such as MOS structures (metal-oxide-semiconductor), MNS structures (metal-nitride-semiconductor), and MIS structures (metal-insulator-semiconductor) devices have been increasingly important. Such devices are currently being employed for integrated and logic circuits as well as memory arrays in which large arrays of small devices are made on a single semiconductor substrate or wafer body. These types of assemblies are commonly referred to as integrated circuits and may incorporate such devices for a number of different types of functions such as memory, decoding, etc. The reliability and yield of the manufacturing operation in such cases is a crucial problem. For instance, a typical memory array might require several thousand active devices per square inch with a hundred percent yield. Interrelated to the yield is the densities (e.g., devices/area) that may be achieved. When higher densities are possible, it may be shown that such higher densities do not necessarily increase the defect probability (i.e., lower the yield). Thus, it may be seen that higher densities will result in greater yields. Thus, the achieving of higher densities is a vital factor in obtaining high yields and economic manufacture of such arrays. The invention herein is directed at a method and structure for providing higher densities.

One form of field effect device, which will be discussed in detail below, is referred to as a silicon gate field effect device which has been referred to by certain persons in the art as an MIS structure. It should be understood at the outset that while the discussion below specifically relates to a silicon gate construction, the reference to such structure is illustrative and many of the advantages herein realized may be applicable to other forms of devices and, in general, to integrated circuit structures. One prior art patent dealing with such structures is U. S. Pat. No. 3,475,234 issued on Oct. 28, 1969 entitled "Method for Making MIS Structures."

In the prior art silicon gate devices (hereinafter referred to as "SGD"), the structure has commonly taken the form of a silicon planar wafer having a source and drain formed therein separated by a channel having a gate spaced between the source and drain and spaced above the channel by an insulator layer. The insulator layer has commonly taken the form of a silicon oxide ($SiO_2$) with the gate formed thereon and separated from the insulator layer by a layer of nitride (e.g., $Si_3N_4$). The formation of such source, drain and composite gate structure has been accomplished in the prior art by successively depositing (e.g., vacuum deposition or growth) layers of a silicon oxide, nitride and silicon over the entire surface of the silicon wafer. Then, by photo lithographic techniques, etching away a portion of the top layer of silicon to generally form the device area, exposing the nitride in this area. This was followed by a forming of a layer of silicon over the entire area. Next by a photomasking step and successive etching, the layers of silicon, nitride and oxide were selectively removed forming the gate structure and exposing the source and drain regions. It was not until the step prior to the diffusing of the impurities into the wafer to form the source and drain, that the surface of the wafer was at all exposed. The workers in the art, considered it highly desirable to protect the wafer surface during a substantial portion of the processing thus avoiding exposure to the ambient and other processing steps which could have a deleterious effect on the processing yield and device characteristics. This protection during processing was one of the main advantages advocated for the silicon gate technology. Further, in one recent publication, it was stated the early protection of the sensitive, thin insulator region by the silicon gate electrodes minimizes the chance of damage during subsequent processing (i.e., see U.S. Pat. No. 3,475,234 and IEE Spectrum, October 1969, pages 28–35). The present process is in direct opposition to this established teaching in the prior art and notwithstanding this, obtains higher densities and substantially the same if not better yields than with prior art technology.

BRIEF SUMMARY OF THE INVENTION

Briefly, the method aspects of this invention comprises exposing a portion of the semiconductor body wherein a contact is to be made prior to the formation of any device or any element of a device therein and forming an electrical contact to said exposed area. The material forming the contact does not substantially inhibit the formation of a device or element thereof in the semiconductor body. Preferably, the contact material is the same material that is employed in an adjacent device as part of the structure therefor. For example, in a silicon gate device, the gate of such adjacent devices is comprised at least in part of silicon. Subsequently, the interconnection between the contact and the adjacent device is formed by photo-lithographic techniques and substantially simultaneously the gate as well as other devices made from the same material are formed. In the case of SGD's, the contact, interconnection and gates are, in part, formed simultaneously and subsequent to this formation, the gates, interconnections, and contacts are made more conductive and the source and drain are formed by an appropriate doping procedure such as the diffusion of a suitable P-type impurity (e.g., boron) or N-type impurity (e.g., phosphorus).

The device of the subject invention comprises an integrated circuit wherein at least one pair of devices is interconnected by a continuous silicon member extending from the drain or source of one device to the gate of the adjacent device. This interconnection construction and the above method enables integrated circuits having high densities without altering existing yields.

DETAILED DESCRIPTION OF THE DRAWINGS

Figures 1A, 1B, 1C, 1D, 1E, 1F:
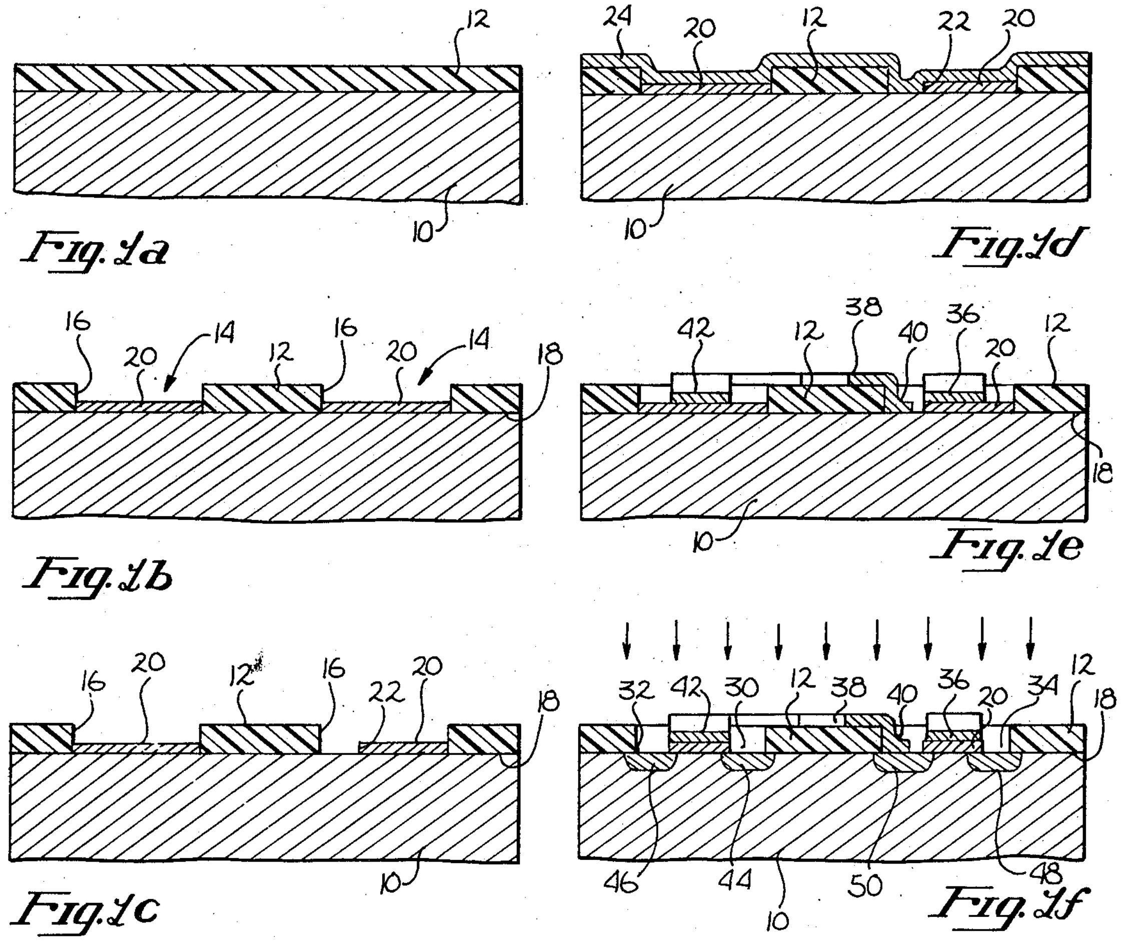
FIG. 1 comprises simplified cross-sectional views of a portion of a device in various stages of fabrication in accordance with this invention.

Referring to FIG. 1*a*, the substrate 10 is preferably a monocrystalline silicon (e.g., 111) oriented, cut and lapped and polished with a well known polishing mixture such as a mixture of hydrofluoric, nitric and acetic acids saturated with iodine. A thick layer of silicon oxide 12 (e.g., $SiO_2$) may be grown at a relatively high temperature (e.g., 1,050°C) or deposited thereon. The film thickness may vary from 100 to several thousand angstroms. However, a suitable thickness is of the order of about 1$\mu$ (micrometer). It is well known that the layer 12 may be formed by such other methods as a decomposition of tetraetheoxysilane or by plasma process as described in U.S. Pat. No. 3,287,243 issued Nov. 22, 1966.

Next, regions for the source and drain of the final device and the eventual channel regions are defined by a photomasking step. This may be performed by conventional photomasking techniques. For example, a layer of photoresist such as KTFR in a 1 to 1 xylene solution is applied to the surface of oxide layer 12 by a syringe or other photoresist applying apparatus. The wafer is spun on a wafer drying machine at a speed such as 15,000 RPM to obtain a uniform coating of a suitable thickness. The resist coated wafer may be further dried by a suitable drying procedure. With the photoresist layer formed, the wafer is held in intimate contact with an appropriate high resolution photomask and exposed to a columnated beam of ultraviolet light. The photomask exposes the photoresist so that when developed, the oxide layer 12 in the vicinity of the areas 14 are uncovered. It is well known that the development of the photoresist is accomplished by immersion in a suitable solvent, rinsing and hardening in an acetone solution and then post baking. With the photoresist so developed, the exposed silicon oxide layer 12 is removed by etching to form openings 16 and uncover the surface 18 of wafer 10 (FIG. 1*b*). With opening 16 formed and the oxide layer 12 removed to expose surface 18, the wafer 10 is again processed through an oxidizing step such as previously described in connection with the formation of layer 12. In this instance, however, a thin oxide layer 20 is formed on the surface 18 in the area of the opening 16 with the formed layer having a thickness of the order of about 0.1$\mu$ (micrometer). The thin oxide layer 20 ultimately forms part of the gate structure.

In prior art methods, it was common to form the additional layers that comprise the gate structure (e.g., $Si_3N_4$, and Si) with the surface 18 remaining completely covered and protected until the exposing of the surface prior to the forming of the source and drain. In most prior art processes it was common to first successively form a thin oxide, nitride and thick oxide layers before performing any photomasking step. In accordance with the present invention, the oxide layer 20 is selectively removed to expose the surface 18 of the wafer 10 in the areas overlying the regions wherein a device or a part thereof is to be formed (FIG. 1*c*). In the present embodiment, an opening 22 is formed in the area overlying the proximity wherein a source or drain of a SGD device is to be subsequently formed. This opening is formed by the photomasking techniques previously discussed in connection with the formation of the opening 16.

In FIG. 1*d*, a layer of silicon 24 is formed over the entire surface. This layer may be deposited by a conventional evaporation process, by pyrolytic decomposition of $SiC_4$ and $H_2$, by cathodic sputtering or by any other known methods. U.S. Pat. No. 3,172,792 issued on Mar. 9, 1965 describes one procedure for forming silicon layer. The silicon layer 24 contacts surface 18 of the wafer 10 via the opening 22 and extends over the oxide layer 12 to overly the thin oxide of an adjacent device wherein the gate thereof is to be formed so that the contact, interconnect, and gate are a continuous member. It should be noted that were the silicon layer 24 contacts the surface 18 of monocrystalline wafer 10, it is probable that in that region the layer 24 takes the form of monocrystalline silicon. In the areas overlying the oxide layers 12 and 20, silicon layer 24 is in the form of a polycrystalline silicon. In the preferred embodiment of the invention, no silicon nitride is formed between the silicon layer 24 and the oxide layers 12 and 20. It is within the broad scope of the invention to form such intermediate layers.

Figure 2:
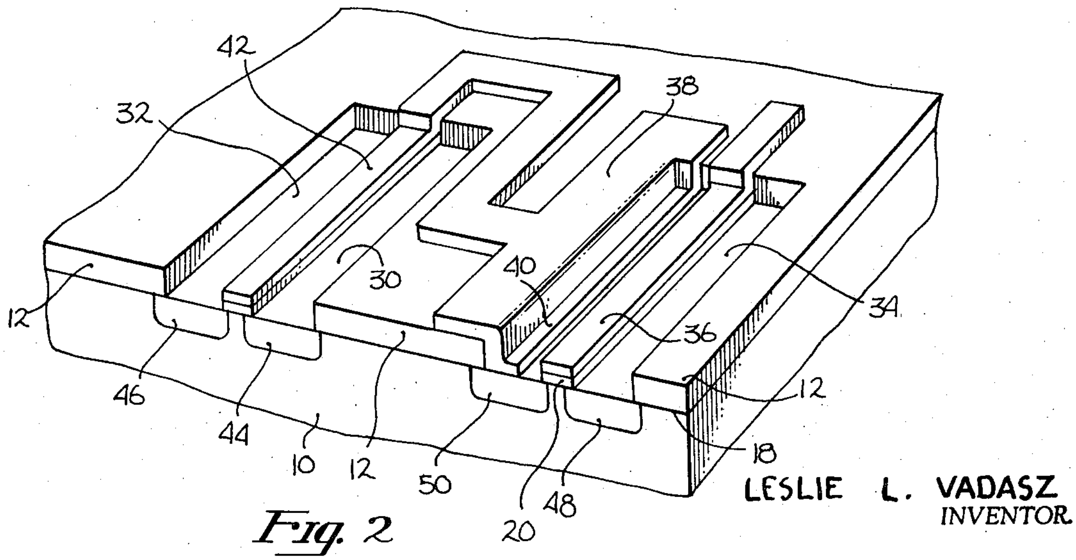
FIG. 2 comprises a perspective view of a portion of a device built in accordance with this invention.

The silicon layer 24 is now processed through a photomasking operation for the purpose of removing all of the silicon with the exception of that silicon which forms the gates, contacts and interconnects and for the purpose of opening the thin oxide where there is no silicon thereover. There is no silicon over the thin oxide layer 20 in the vicinity where the source and drain are to be formed. In other instances, the thin oxide would also be removed where diffused resistors are to be formed in the wafer 10. It should be understood in FIG. 1*e* that the silicon layer 24 is shown in a simple and schematic form and appears to overly thin oxide layer 20 in the vicinity of the source and drain while in fact it is offset from the source and drain (FIG. 2). The thin oxide in the vicinity of the source and drain is exposed and accessible to an etching step whereby openings 30 along with openings 32 and 34 are simultaneously formed (FIG. 1*f*).

Returning to the forming of silicon layer 24 by the photomasking operation, as shown in FIG. 1*e*, the removal of the excess silicon results in the forming of a gate 36, and an interconnect 38 which includes a contact 40 and extends to the gate 42 of the adjacent device. This forming of the silicon involves photoresist and etching operations which may be performed in the same manner as previously discussed. The silicon left exposed after the photoresist is applied is etched away by an appropriate etching solution such as a mixture of hydrofluoric nitric and acetic acids saturated with iodine. It should be noted that the forming of the gate involves an automatic alignment feature, that is, the photoresist mask for etching the gate electrode need not be critically placed. The only essential requirement in the registration of the photoresist mask is that the gate area be contained somewhere over the thin oxide. With the forming of the silicon, the configuration of the gate structure and the resulting device is beginning to become apparent (FIG. 1*e*).

With the silicon layer 24 formed into a gate a contact, and an interconnect pattern, the underlying thin oxide layer 20 is exposed in the vicinity where the source and drain are to be formed. This exposed underlying $SiO_2$ via 20 may be removed with ammonium bifluoride thereby exposing the surface 18 of silicon wafer 10 on each side of the gate 36 with the exception of those areas wherein silicon layer 24 has already formed a contact 40 with the silicon wafer 10. Thus openings 30, 32 and 34 are formed exposing the wafer 10 thereunder. These openings permit selected impurities to be diffused into wafer 10 for form source and drain regions 44, 46 and 48. In addition, the silicon contact 40 compared to silicon dioxide does not present a substantial barrier to such selected impurities and these impurities pass through the contact 40 to form a source or drain region 50.

Diffusion step is performed, in which the source regions, drain regions, gates, silicon contact and interconnect are completed. It is noted that since the diffusion step has been performed after the gate is located, the proper positioning of the source and drain junctions with respect to the gate to give a definite but minimum overlap is assured. In addition, the gates, contact and interconnects become sufficiently doped with impurities to become more conductive. Typically, after doping contact 40, gates 36 and 42 and interconnect 38 have a resistance of less than 200 ohms per square. Typical diffusion operations are discussed in numerous patents such as U.S. Pat. No. 3,066,052 issued on Nov. 27, 1962. The particular conductivity type may be a P-type silicon with N-type source and drain regions, however, structures with reverse conductivity type relationships can be made employing an N-type substrate and a P-type impurity such as boron in place of an N-type impurity which may be phosphorus. FIG. 1*f* shows a wafer at this stage in processing.

After the diffusion step, the device structure, except for necessary interconnections and passivation, is now complete. A layer of silicon dioxide, glass or other insulation material is deposited onto the entire surface. Openings are photoetched in this deposited silicon dioxide layer wherever a contact between the subsequent metalization and the underlying silicon wafer or deposited silicon is desired. Aluminum is evaporated onto the surface so that it enters into these openings and the desired interconnection patterns are defined by another photomasking operation. It is desirable to protect the device both for mechanical damage to its interconnection pattern and from contamination. For this reason, another layer of glass may be deposited onto the wafer surface and patterned by a subsequent photomasking and etching to expose the pads where bonding wires are to make contact with the aluminum interconnection pattern. Other steps such as annealing and alloying may be employed as is well known in the art. All of these subsequent steps are primarily directed toward the formation of an interconnection layer and device protection and are described in such patents as heretofore necessary.

Referring to FIG. 2, the device as it exists in FIG. 1*f* is shown in a simplified perspective representation. The device shown comprises a wafer of monocrystalline P-type silicon 10 containing N-type diffused regions 48 and 50. A thick layer of insulating film 12 overlies a substantial portion of the wafer 10 (10,000 angstroms). A thinner layer of insulating film 20 is located between source and drain regions 48 and 50 in an overlying relationship thereto (1,000 angstroms). A gate electrode 36 is coincidentally formed on the thin insulating film layer 20 and preferably made of silicon with suitable selected conductive impurities therein. The region 50 has a contact 40 formed thereon and continuous with this contact is an interconnecting portion 38 which connects the region 50 to another device such as the gate of an adjacent device. Preferably, the contact 40, interconnect 38 and gate of the adjacent device (e.g., gate) are all made from the same material and in a continuous form which is preferably silicon.

I claim:

1. In a method for forming an integrated circuit having a gate type device with a source and drain therein including a semiconductor wafer having a planar surface the steps comprising:

forming a masking layer on said planar surface;

forming an opening in said masking layer;

depositing a contact and interconnect material on said masking layer and in said opening which material is substantially more permeable to dopants employed to form an impurity region in said wafer then said masking layer;

forming said contact and interconnect material into a pattern wherein said material extends from the source or drain of one gate type device to another device; and diffusing impurities into said semiconductor wafer via said contact material in said opening to form an impurity region beneath said contact and proximity thereto comprising said source or drain of a gate type device.

2. The method of claim 1 wherein said semiconductor wafer is silicon.

3. The method of claim 2 wherein said interconnect material is silicon.

4. The method of claim 3 wherein said masking material is silicon dioxide.

5. The method of claim 1 wherein said integrated circuit includes at least a plurality silicon gate field effect devices comprising a source, drain and gate and wherein said patterning of the interconnect material simultaneously forms a contact to one device interconnected to the gate of another device which gate is simultaneously formed.

6. The method of claim 1 wherein said impurities are simultaneously diffused into said interconnect and contact material.

7. The method of claim 5 wherein said impurities are simultaneously diffused into said interconnect, said contact material and said gate.

* * * * *